United States Patent [19]
Felps

[11] Patent Number: 6,064,268
[45] Date of Patent: May 16, 2000

[54] PRECISION EMITTER FOLLOWER

[75] Inventor: Jimmie D Felps, Colorado Springs, Colo.

[73] Assignee: Hewlett—Packard Company, Palo Alto, Calif.

[21] Appl. No.: 09/239,418

[22] Filed: Jan. 28, 1999

[51] Int. Cl.[7] ...................................................... H03F 3/04
[52] U.S. Cl. ........................................... 330/288; 330/296
[58] Field of Search .................................. 330/288, 296, 330/311, 207, 298, 136

[56] References Cited

U.S. PATENT DOCUMENTS

| | | | |
|---|---|---|---|
| 4,891,607 | 1/1990 | Felps .......................................... | 330/296 |
| 5,448,770 | 9/1995 | Hietala et al. ............................ | 330/288 |
| 5,637,993 | 6/1997 | Whitney et al. ......................... | 330/288 |
| 5,812,029 | 9/1998 | Prentice ................................... | 330/288 |
| 5,923,217 | 9/1995 | Durec ....................................... | 330/296 |

OTHER PUBLICATIONS

Data Sheet from OP–07, Made by Analog Devices, Ultralow Offset Voltage Operational Amplifier, OP07; pp. 1–10.

*Primary Examiner*—Robert Pascal
*Assistant Examiner*—Khanh Van Nguyen

[57] ABSTRACT

A first current source supplies current to the collector of an emitter follower stage and a sense transistor. The sense transistor programs a current mirror so that most of the base current required by the emitter follower transistor comes from the current mirror instead of the input. A second current source that requires more current that the first current source supplies is connected to the output of the emitter follower and sinks the current coming out of the emitter of the emitter follower and the collector current of a load transistor. The load transistor supplies the difference in current between the amount of current supplied by the first current source and the amount sunk by the second current source.

11 Claims, 3 Drawing Sheets

PRECISION EMITTER FOLLOWER

CROSS-REFERENCE TO RELATED APPLICATIONS

This application is related to the application entitled "HIGH PERFORMANCE OPERATIONAL AMPLIFIER", also filed by applicant in the United States Patent and Trademark Office on about the same day as the present application, Ser. No. 09/239,128, Hewlett-Packard Docket number 10980376-1.

FIELD OF THE INVENTION

This invention relates to drive amplifiers. In particular, this invention relates to a precision emitter follower stage.

BACKGROUND OF THE INVENTION

The emitter follower stage (also known as the common collector stage) is widely used in analog circuit designs. Its uses include buffering, level-shifting, and as an output stage. Some of the characteristics used to measure a good emitter follower stage are high input impedance, low input current, low output impedance, low gain compression, low distortion, and a gain that is near unity. Since these characteristics are desirable, there is a continuing need in the art to improve them.

One improvement over the basic emitter follower that improves at least some of these characteristics over the basic emitter follower is described in U.S. Pat. No. 4,891,607, titled LOW DISTORTION DRIVE AMPLIFIER which is hereby incorporated herein by reference. However, this design involves a differential input, and works best with a constant load impedance and a conventional amount of input current.

Accordingly, there is a need in the art for an emitter follower stage with a single-ended input that works well with different load impedance's and also has high input impedance, low input current, low output impedance, low gain compression, low distortion, and gain that is near unity.

SUMMARY OF THE INVENTION

In a preferred embodiment, the invention provides an amplifier stage with a single-ended input that works well with different load impedances as well as having high input impedance, low input current, low output impedance, low gain compression, low distortion, and near unity gain. A first current source supplies current to the collector of the emitter follower stage and a sense transistor. The sense transistor programs a current mirror so that most of the base current required by the emitter follower transistor comes from the current mirror instead of the input. Accordingly, this helps lower the input current. A second current source connected to the output of the emitter follower sinks the current coming out of the emitter of the emitter follower transistor, and the quiescent, no load, collector current of an additional transistor. When a load is present, this additional transistor supplies the load current and load current changes. Since the load current is not coming from the emitter follower transistor, this additional transistor helps maintain a constant current thought the emitter follower circuit. This combination provides an emitter follower stage that has a single-ended input, high input impedance, low input current, low output impedance, low gain compression, low gain compression, and near unity gain.

DETAILED DESCRIPTION OF THE PREFERRED EMBODIMENTS

Figure 1:
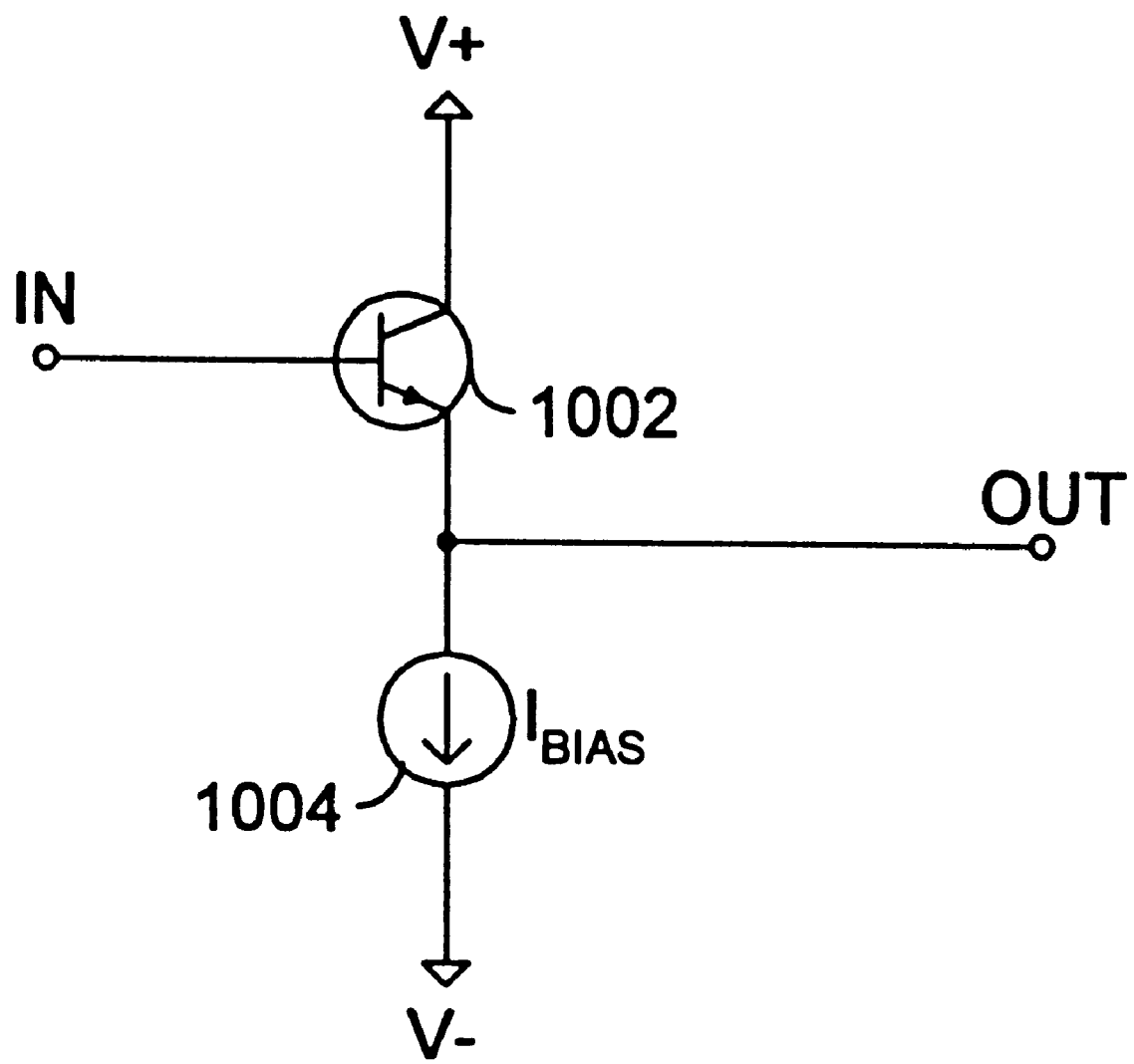
FIG. 1 is schematic diagram of a basic emitter follower stage.

A basic emitter follower stage is shown in FIG. 1. The basic emitter follower stage shown in FIG. 1 has an emitter follower transistor 1002 and an independent current source 1004 that biases emitter follower transistor 1002. Current source 1004 is set at a bias current of $I_{BIAS}$. The input to the emitter follower stage, IN, is connected to the base of the emitter follower transistor 1002. The output of the emitter follower stage, OUT, is connected to the emitter of the emitter follower transistor and one terminal of the current source 1004. The other terminal of current source 1004 is connected to the negative supply terminal, V−. This causes a bias current of $I_{BIAS}$ to flow from the OUT node to the negative supply terminal, V−. The collector of the emitter follower transistor is connected to the positive supply terminal, V+. Note that the base current of the emitter follower transistor 1002 is supplied by the signal source driving the input to the emitter follower stage.

Figure 2:
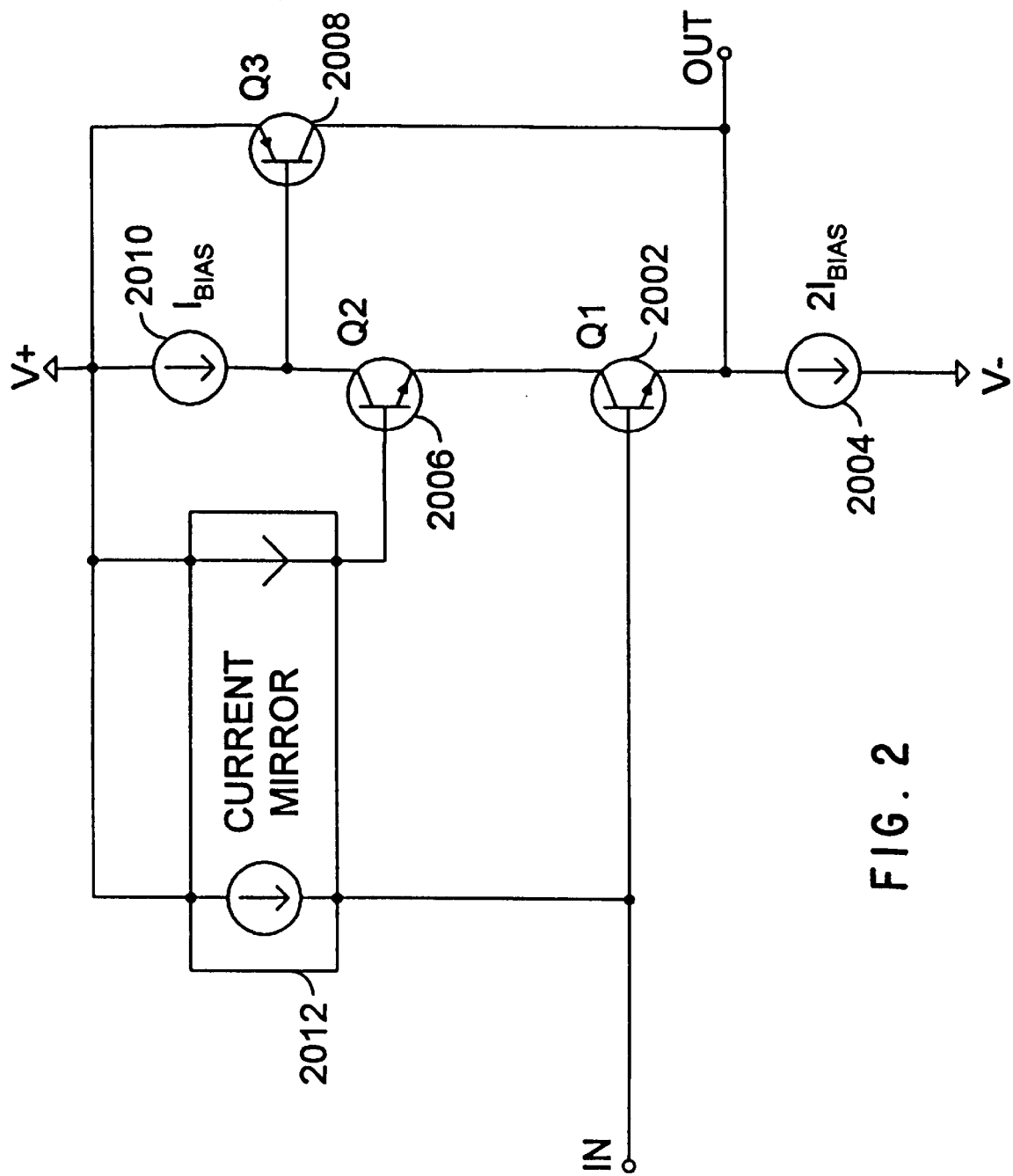
FIG. 2 is a schematic diagram of a precision emitter follower stage.

FIG. 2 is a schematic diagram of a precision emitter follower stage. The precision emitter follower stage is biased by current sources 2010 and 2004. Current source 2010 is set at a bias current of $I_{BIAS}$. Current source 2004 is set at $2*I_{BIAS}$. One terminal of current source 2010 is connected to the positive supply terminal, V+. The other terminal of current source 2010 is connected to the collector of sense transistor Q2, 2006, and the base of drive transistor Q3, 2008. This causes a current of $I_{BIAS}$ to flow from the positive supply terminal through current source 2010 to the node connected to the collector of Q2. Drive transistor Q3 is chosen to be the opposite type of transistor as Q2 (i.e. when Q2 is an NPN transistor, Q3 is chosen to be a PNP transistor.) The emitter of Q3 is connected to the positive supply terminal, V+. The collector of Q3 is connected to the output node, OUT.

The base of sense transistor Q2 is connected to a sense terminal of a current mirror 2012 such that the current mirror 2012 will mirror the current flowing into the base of transistor Q2. The output terminals of current mirror 2012 are connected between the positive supply terminal V+ and the input node IN so that current mirror 2012 will deliver an amount of current equal to the base current of transistor Q2 to the input node IN. The emitter of sense transistor Q2 is connected to the collector of emitter follower transistor Q1, 2002.

The base of emitter follower transistor, Q1, is connected to the input node IN. The emitter of transistor Q1 is connected to the output node. The output node is also connected to one terminal of current source 2004. The other terminal of current source 2004 is connected to the negative supply terminal V− so that current source 2004 causes a bias current of $2*I_{BIAS}$ to flow from the output node OUT to the negative supply terminal V−.

Transistor Q2 and current mirror 2012 operate to help cancel out the input current required by the basic emitter follower stage. The collector current through Q1, $I_{C,Q1}$, is equal to the collector current through Q2, $I_{C,Q2}$ plus the base current into Q2, $I_{B,Q2}$. In other words, $I_{C,Q1} = I_{C,Q2} + I_{B,Q2}$. Assuming the beta of transistors Q1 and Q1 is reasonably high, for example, 50, then $I_{B,Q2}$ is much less than $I_{C,Q2}$.

This allows the base current of Q2 to be neglected and the previous equation reduces to: $I_{C,Q1} \approx I_{C,Q2}$. Since Q1 and Q2 are matched, this can be translated to: $I_{B,Q1} \approx I_{B,Q2}$. Current mirror 2012 mirrors $I_{B,Q2}$ and supplies this current to the base of Q1. Therefore, current mirror 2012 is supplying almost the correct amount of the base current $I_{B,Q1}$ and the only input current that needs to be supplied to (or sunk from) the precision emitter follower stage is the difference between $I_{B,Q1}$ and $I_{B,Q2}$.

The emitter current of the emitter follower transistor Q1 can be expressed as: $I_{E,Q1}=I_{BIAS}+I_{B,Q3}+I_{B,Q2}+I_{B,Q1}$. Assuming the beta of transistors Q1 and Q2 are reasonably high then the base currents of these transistors may be neglected and the previous equation reduces to $I_{E,Q1} \approx I_{BIAS}+I_{B,Q3}$. If the precision emitter follower is required to supply a load current of $I_L$ out of the OUT node, summing the currents into the OUT node yields: $I_{E,Q1}-2I_{BIAS}+I_{C,Q3}-I_L=0$. Substituting the previous relation for $I_{E,Q1}$ into this equation gives: $I_L \approx I_{B,Q3}+I_{C,Q3}-I_{BIAS}$. Note that since $I_{BIAS}$ is constant, any change in $I_L$, $\Delta I_L$, would have to come from changes in $I_{B,Q3}$ and $I_{C,Q3}$. Note also that if the beta of Q3 is reasonably high then almost all of the change in $I_L$ would come from the change in $I_{C,Q3}$, not the change in $I_{B,Q3}$. For example, if the beta of transistor Q3 is 99, then a 10 mA change in $I_L$ only results in a 0.1 mA change in $I_{B,Q3}$ but a 9.9 mA change in $I_{C,Q3}$. Therfore, since $I_{E,Q1} \approx I_{BIAS}+I_{B,Q3}$, and $I_{BIAS}$ is constant, then $I_{E,Q1}$ stays approximately constant as the load current varies. This helps maintain a relatively constant gain and output impedance. Keeping these factors constant helps reduce distortion.

In FIG. 2, the current through current source 2004 was chosen to be $2I_{BIAS}$. This produced a quiescent current through Q3 of approximately $I_{BIAS}$. However, the quiescent current through Q3 could have been chosen to be some other value. Furthermore, Q3 does not need to be matched to any other transistor in the circuit to function properly. When there is a load, and the input voltage changes, transistor Q3 will supply the load current changes to keep the current in transistor Q1 at approximately $I_{BIAS}$.

Figure 3:
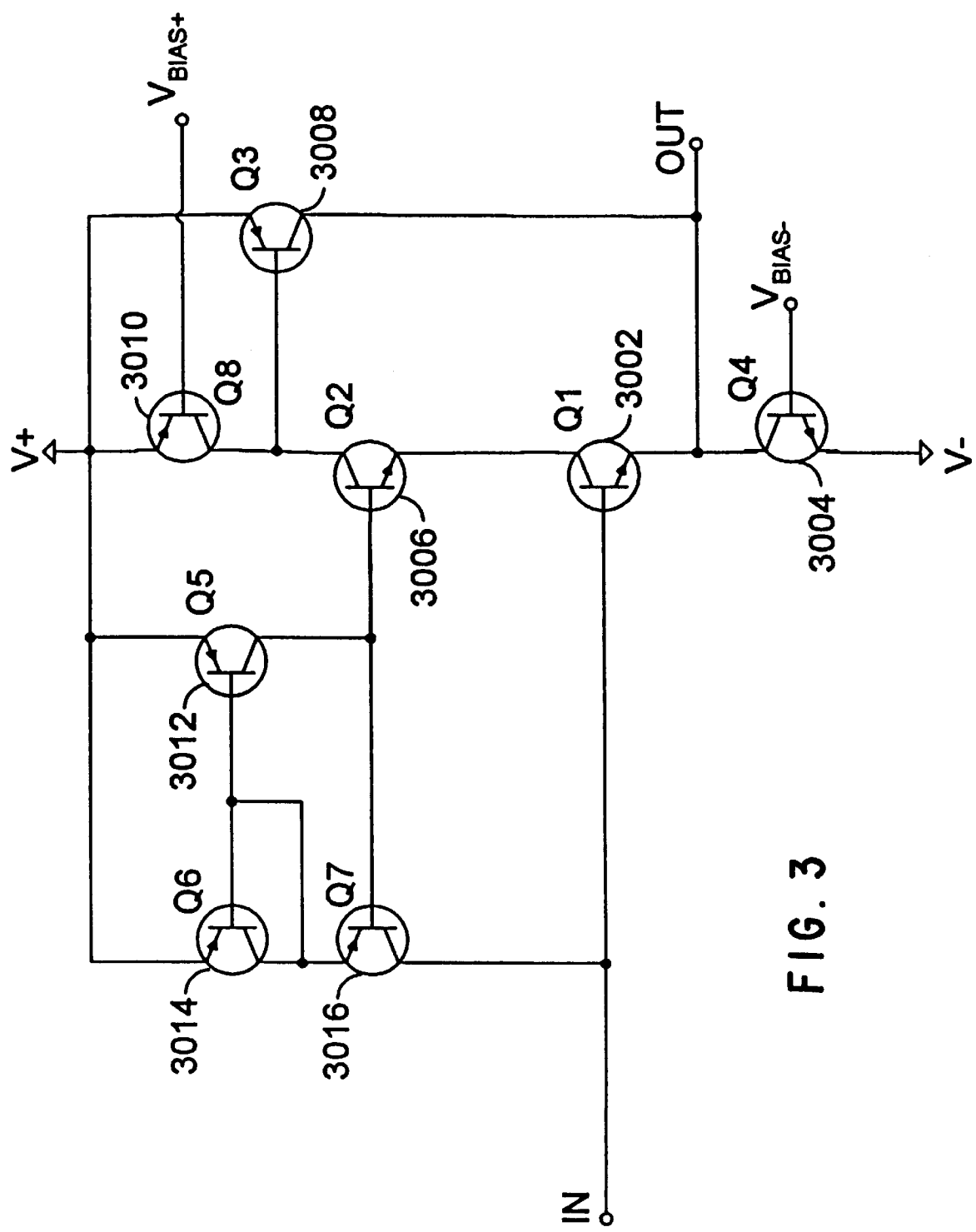
FIG. 3 is a schematic diagram of a precision emitter follower stage with the current sources implemented using transistors.

FIG. 3 is a schematic diagram of a precision emitter follower stage with the current sources implemented using transistors. In FIG. 3, current mirror 2012 of FIG. 2 is implemented using PNP type transistors arranged as a Wilson current mirror. The emitters of transistors Q5 3012 and Q6 3014 are connected to the positive supply terminal V+. The collector of Q6 and the bases of both Q5 and Q6 are connected to the emitter of Q7 3016. The base of Q7 is connected to the collector of Q5 and the base of the sense transistor Q2 3006. The collector of Q7 is connected to the input node, IN, which is also connected to the base of the emitter follower transistor, Q1 3002. Also in FIG. 3, current source 2010 of FIG. 2 is implemented using PNP transistor Q8, 3010. The emitter of Q8 is connected to the positive supply V+. The base of Q8 is connected to bias voltage $V_{BIAS+}$. The collector of Q8 is connected to the collector of the sense transistor Q2 3006 and the base of drive transistor Q3 3008. The emitter and collector of drive transistor Q3 are connected to the positive supply terminal V+ and the output terminal OUT, respectively. The emitter of sense transistor Q2 is connected to the collector of the emitter follower transistor Q1. The emitter of Q1 is connected to the output terminal OUT and the collector of transistor Q4 3004. Transistor Q4 implements current source 2004 of FIG. 2. The base of Q4 is connected to bias voltage $V_{BIAS-}$.

The bias voltages $V_{BIAS+}$ and $V_{BIAS-}$ may be generated using circuits and techniques well known in the art. Some of these techniques and circuits, as well as other circuits for current sources and current mirrors are shown in *Bipolar and MOS Analog Integrated Circuit Design* by Alan B. Grebene, John Wiley & Sons, Inc., New York, copyright 1984, which is hereby incorporated herein by reference. The exact values of the bias voltages and the sizing of transistors Q4 and Q8 may be used to set the bias currents and the ratios between the current sources implemented by Q4 and Q8.

From the foregoing it will be appreciated that the precision emitter follower stage provided by the present invention offers numerous advantages. Such an emitter follower has a single-ended input, high input impedance, low input current, low output impedance, low gain compression, and near unity gain.

Although several specific embodiments of the invention have been described and illustrated, the invention is not to be limited to the specific forms or arrangements so described and illustrated. For example, the invention has been shown using an NPN bipolar transistor as the emitter follower transistor. With an appropriate translation of parts, the invention could be implemented using a PNP bipolar transistor as the emitter follower transistor. The invention is limited only by the claims.

What is claimed is:

1. An amplifier, comprising:
   an emitter follower transistor of a first conductivity type and having an input terminal, and first and second bias terminals;
   a load transistor having a load output terminal, a supply terminal, and a control terminal;
   a first constant current means, said first constant current means drawing a first fixed current from said second bias terminal and said load output terminal;
   a sense transistor having a first sense terminal, a second sense terminal, and a sense output terminal;
   a second constant current means, said second constant current means forcing a second fixed current through said sense transistor from said first sense terminal to said second sense terminal and into said first bias terminal, and wherein a difference in current between said first fixed current and said second fixed current causes said control terminal to control said load transistor to supply said difference in current to said first constant current means, and
   a current mirror, said current mirror providing a duplicate current, said duplicate current being a duplicate of a sense current that flows into said sense output terminal, and wherein said duplicate current is provided to said input terminal.

2. The amplifier of claim 1 wherein said load transistor is of a second conductivity type.

3. The amplifier of claim 2 wherein said sense transistor is of said first conductivity type and wherein said sense transistor is matched to said emitter follower transistor.

4. The amplifier of claim 3 wherein said current mirror comprises a wilson current mirror.

5. The amplifier of claim 3 wherein the magnitude of the current through said first constant current means is larger than the magnitude of the current through said second constant current means.

6. The amplifier of claim 5 wherein the magnitude of the current through said first constant current means is approximately twice the magnitude of the current through said second constant current means.

7. An amplifier, comprising:
   an emitter follower circuit having an input terminal, and first and second bias terminals;

a load circuit having a load output terminal and a supply terminal wherein said load output terminal supplies a load current from said supply terminal to said load output terminal that is controlled by a control terminal;

a first constant current circuit, said first constant current circuit drawing a first fixed current from said second bias terminal and said load output terminal;

a sense circuit having a first sense terminal, a second sense terminal, and a sense output terminal;

a second constant current circuit, said second constant current means forcing a second fixed current through said sense circuit from said first sense terminal to said second sense terminal and into said first bias terminal, and wherein said control terminal is connected to said first sense terminal, and, a current mirror circuit said current mirror circuit providing a duplicate current, said duplicate current being a duplicate of a sense current that flows into said sense output terminal, and wherein said duplicate current is provided to said input terminal.

8. The amplifier of claim 7 wherein said sense circuit is matched to said emitter follower circuit.

9. The amplifier of claim 7 wherein said current mirror circuit comprises a wilson current mirror.

10. The amplifier of claim 9 wherein the magnitude of the current through said first constant current circuit is larger than the magnitude of the current through said second constant current circuit.

11. The amplifier of claim 10 wherein the magnitude of the current through said first constant current circuit is approximately twice the magnitude of the current through said second constant current circuit.

* * * * *